United States Patent
Chou et al.

(10) Patent No.: US 10,002,899 B2
(45) Date of Patent: Jun. 19, 2018

(54) MICROLENS FOR A PHASE DETECTION AUTO FOCUS (PDAF) PIXEL OF A COMPOSITE GRID STRUCTURE

(71) Applicant: Taiwan Semiconductor Manufacturing Co., Ltd., Hsin-Chu (TW)

(72) Inventors: Keng-Yu Chou, Kaohsiung (TW); Chien-Hsien Tseng, Hsinchu (TW); Wei-Chieh Chiang, Yuanlin Township (TW); Wen-I Hsu, Tainan (TW); Yuichiro Yamashita, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 14/855,429

(22) Filed: Sep. 16, 2015

(65) Prior Publication Data
US 2017/0077163 A1    Mar. 16, 2017

(51) Int. Cl.
*H01L 27/146*    (2006.01)
*H04N 5/232*    (2006.01)

(52) U.S. Cl.
CPC .. *H01L 27/14627* (2013.01); *H01L 27/14605* (2013.01); *H01L 27/14607* (2013.01); *H01L 27/14645* (2013.01); *H01L 27/14685* (2013.01); *H04N 5/23212* (2013.01); *H01L 27/1464* (2013.01); *H01L 27/14621* (2013.01); *H01L 27/14636* (2013.01); *H01L 27/14698* (2013.01)

(58) Field of Classification Search
CPC ......... H01L 27/14627; H01L 27/14607; H01L 27/14621; H01L 27/1464; H01L 27/14645
See application file for complete search history.

(56) References Cited

U.S. PATENT DOCUMENTS

| | | | |
|---|---|---|---|
| 7,505,206 B2 | 3/2009 | Deng et al. | |
| 2003/0000644 A1* | 1/2003 | Subramanian | G01N 21/4738 156/345.24 |
| 2007/0238034 A1* | 10/2007 | Holscher, Jr. | H01L 27/14621 430/7 |
| 2009/0122171 A1* | 5/2009 | Suzuki | H04N 5/23212 348/294 |
| 2014/0145068 A1 | 5/2014 | Meynants | |
| 2014/0176780 A1* | 6/2014 | Koshiba | G02B 7/34 348/336 |

(Continued)

*Primary Examiner* — Fei Fei Yeung Lopez
(74) *Attorney, Agent, or Firm* — Eschweiler & Potashnik, LLC

(57) ABSTRACT

An image sensor for high angular response discrimination is provided. A plurality of pixels comprises a phase detection autofocus (PDAF) pixel and an image capture pixel. Pixel sensors of the pixels are arranged in a semiconductor substrate. A grid structure is arranged over the semiconductor substrate, laterally surrounding color filters of the pixels. Microlenses of the pixels are arranged over the grid structure, and comprise a PDAF microlens of the PDAF pixel and an image capture microlens of the image capture pixel. The PDAF microlens comprises a larger optical power than the image capture microlens, or comprises a location or shape so a PDAF receiving surface of the PDAF pixel has an asymmetric profile. A method for manufacturing the image sensor is also provided.

19 Claims, 15 Drawing Sheets

(56) References Cited

U.S. PATENT DOCUMENTS

| | | | |
|---|---|---|---|
| 2014/0225215 A1* | 8/2014 | Chien | H01L 24/05 257/447 |
| 2014/0313379 A1* | 10/2014 | Mackey | H04N 9/045 348/279 |
| 2015/0035104 A1* | 2/2015 | Horikoshi | H01L 27/14627 257/432 |
| 2015/0062390 A1* | 3/2015 | Kim | G02B 7/34 348/273 |
| 2015/0076643 A1* | 3/2015 | Kikuchi | H01L 27/14621 257/432 |
| 2015/0102442 A1* | 4/2015 | Ootsuka | H04N 5/23212 257/432 |
| 2015/0195466 A1* | 7/2015 | Takase | H04N 5/369 348/294 |
| 2016/0276396 A1* | 9/2016 | Tayanaka | H01L 27/14623 |

\* cited by examiner

MICROLENS FOR A PHASE DETECTION AUTO FOCUS (PDAF) PIXEL OF A COMPOSITE GRID STRUCTURE

BACKGROUND

Many modern day electronic devices comprise optical imaging devices (e.g., digital cameras) that use image sensors. An image sensor may include an array of pixel sensors and supporting logic. The pixel sensors measure incident radiation (e.g., light), and the supporting logic facilitates readout of the measurements. One type of image sensor commonly used in optical imaging devices is a back-side illumination (BSI) image sensor. BSI image sensor fabrication can be integrated into conventional semiconductor processes for low cost, small size, and high through-put. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
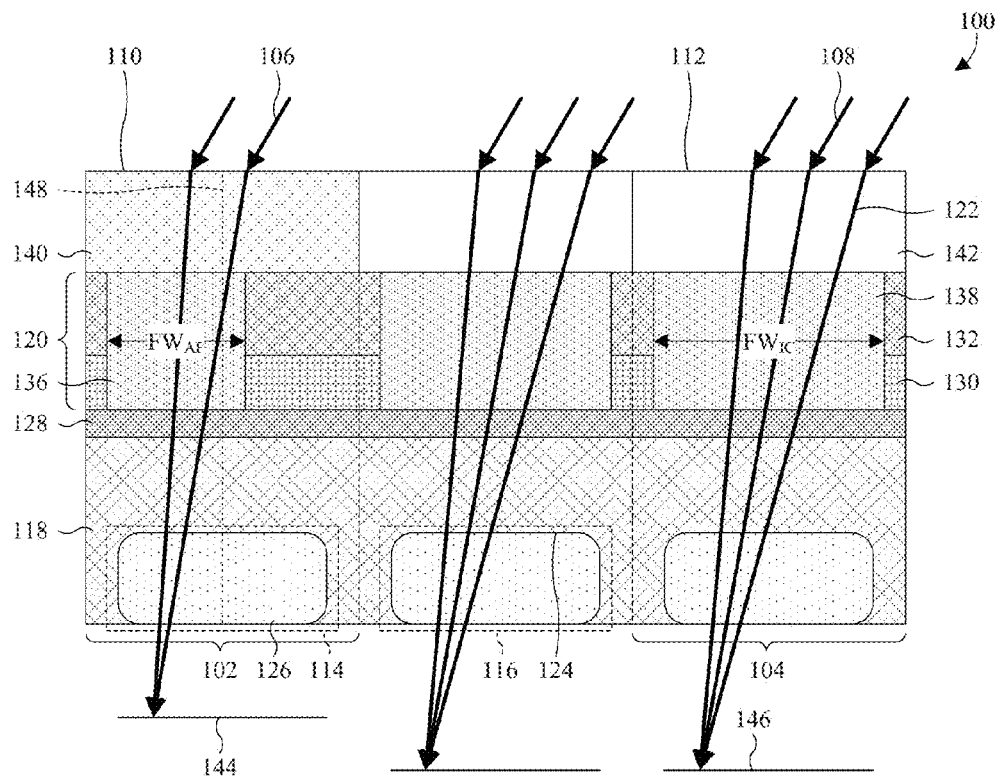
FIG. 1 illustrates a cross-sectional view of some embodiments of a backside illumination (BSI) image sensor with a phase detection auto focus (PDAF) pixel comprising a microlens for good angular response discrimination.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some back side illumination (BSI) image sensors include an array of pixels arranged on a backside of an integrated circuit (IC). The pixels comprise corresponding pixel sensors arranged within a semiconductor substrate, as well as a composite grid structure overlying the semiconductor substrate. The composite grid structure laterally surrounds color filters corresponding to the pixels, and comprises a metal grid structure and a dielectric grid structure overlying the metal grid structure. The composite grid structure increases sensitivity (e.g., quantum efficiency (QE)) and reduces cross talk by total internal reflection off the dielectric grid structure, but may also hinder phase detection autofocus (PDAF).

PDAF is used to quickly focus on an object by determining distance to the object from a phase difference of radiation incident on pairs of PDAF pixels. First PDAF pixels of the pairs comprise pixel sensors partially obstructed from incident radiation on first sides, so angular response curves (ARCs) of the first PDAF pixels are offset from a reference angle in a first direction. An ARC describes sensitivity as a function of incident angle. Second PDAF pixels of the pairs comprise pixel sensors partially obstructed from incident radiation on second sides, so ARCs of the second PDAF pixels are offset from the reference angle in a second direction opposite the first direction. However, due to the increased sensitivity from the composite grid structure, the ARCs have reduced steepnesses and/or offsets. This, in turn, reduces angular response discrimination and makes it more challenging to determine a phase difference.

The present application is directed to a BSI image sensor with a PDAF pixel that achieves good angular response discrimination. In some embodiments, the BSI image sensor comprises a PDAF pixel and an image capture pixel respectively comprising a pixel sensor arranged within a semiconductor substrate and configured to receive radiation. A grid structure is arranged over the semiconductor substrate, laterally surrounding color filters corresponding to the pixels. Microlenses corresponding to the pixels are arranged over the color filters and are configured to focus radiation towards the pixel sensors. A PDAF microlens of the PDAF pixel is configured to change the focus of incident radiation (e.g., to focus incident radiation at a steeper angle), relative to an image capture microlens of the image capture pixel, to increase angular response discrimination of the PDAF pixel.

Due to the PDAF microlens, the PDAF pixel advantageously has good angular response discrimination for PDAF. In some embodiments, the good angular response discrimination is the result of high sensitivity within a range of incident angles, and/or sensitivity restricted to a small range of incident angles. Further, in some embodiments, the good angular response discrimination is the result of a large distance between incident angles of peak sensitivity for the PDAF pixel and the image capture pixel.

With reference to FIG. 1, a cross-sectional view 100 of some embodiments of a BSI image sensor with an array of pixels 102, 104 is provided. The pixels 102, 104 are sensitive to incident radiation 106, 108 on corresponding receiving surfaces 110, 112 (e.g., upper surface regions of the BSI image sensor that are delineated by boundaries or interfaces of the pixels 102, 104), and comprise a PDAF pixel 102 and an image capture pixel 104.

Pixel sensors 114, 116 corresponding to the pixels 102, 104 are arranged within a semiconductor substrate 118, and a grid structure 120 is arranged over the semiconductor substrate 118. The pixel sensors 114, 116 are configured to measure the intensity of incident radiation 122 on sensing surfaces 124 of the pixel sensors 114, 116 and, in some embodiments, to facilitate readout of the measurements. The pixel sensors 114, 116 may comprise, for example, photodiodes 126. The grid structure 120 is separated from the semiconductor substrate 118 by one or more dielectric layers 128. Further, the grid structure 120 comprises a metal grid structure 130 blocking incident radiation and, in some embodiments, a dielectric grid structure 132 arranged over the metal grid structure 130.

Color filters 136, 138 corresponding to the pixels 102, 104 are arranged within the grid structure 120, and configured to filter radiation in route to the pixel sensors 114, 116. A PDAF color filter 136 of the PDAF pixel 102 has a PDAF filter width $FW_{AF}$, and an image capture color filter 138 of the image capture pixel 104 has an image capture filter width $FW_{IC}$. In some embodiments, the PDAF filter width $FW_{AF}$ is less than the image capture filter width $FW_{IC}$, and/or the PDAF color filter 136 is arranged on a first side of the PDAF pixel 102, closer to the first side than an opposing second side of the PDAF pixel 102. In other embodiments, the PDAF filter width $FW_{AF}$ is substantially equal to the image capture filter width $FW_{IC}$.

Microlenses 140, 142 corresponding to the pixels 102, 104 are arranged over the color filters 136, 138, and configured to focus incident radiation 106, 108 towards the pixel sensors 114, 116 and on corresponding focal planes 144, 146. A PDAF microlens 140 of the PDAF pixel 102 has different optical properties than an image capture microlens 142 of the image capture pixel 104. For example, the PDAF microlens 140 may have an optical power (i.e., a degree to which the microlens converges or diverges light) larger than an optical power of the image capture microlens 142, and/or may have a shape or location so a PDAF receiving surface 110 of the PDAF pixel 102 has an asymmetric profile about a PDAF axis 148 normal to the sensing surfaces 124. In some embodiments, the PDAF axis 148 is arranged at a center (e.g., a centroid) of a PDAF pixel sensor 114 of the PDAF pixel 102. In other embodiments, such as where a chief ray angle (CRA) of the PDAF pixel 102 is non-zero, the axis 148 is laterally offset from the center of the PDAF pixel sensor 114, towards pixels with a CRA of zero, and in proportion to the magnitude of the non-zero CRA.

The larger optical power and/or the asymmetric profile advantageously promote good angular response discrimination for PDAF. In some embodiments, the good angular response discrimination is the result of high sensitivity within the PDAF range of incident angles and/or a small size of the PDAF range. Further, in some embodiments, the good angular response discrimination is the result of a large distance between incident angles of peak sensitivity for the PDAF pixel and the image capture pixel.

Figure 2:
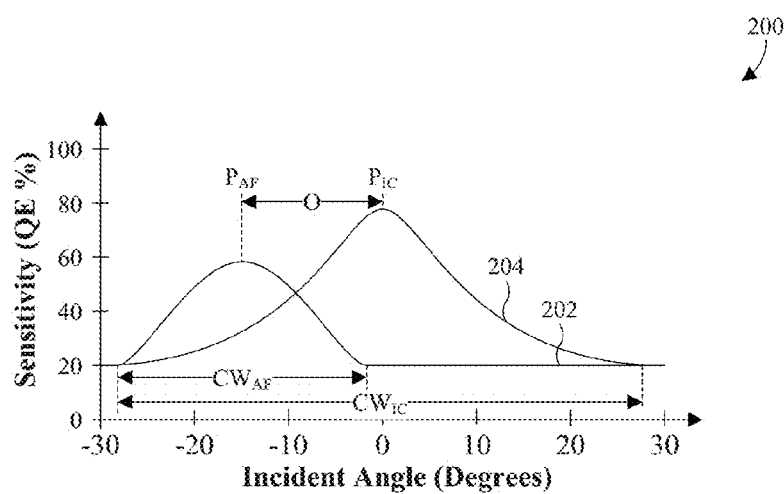
FIG. 2 illustrates a graph of some embodiments of angular response curves (ARCs) for PDAF and image capture pixels in FIG. 1.

With reference to FIG. 2, a graph 200 illustrates some embodiments of angular response curves (ARCs) 202, 204 for the PDAF and image capture pixels 102, 104 of FIG. 1. The ARCs 202, 204 describe sensitivity (e.g., quantum efficiency) as a function of incident angle, and may be modeled as, for example, Gaussian curves. Incident angles are relative to an optical axis of the BSI image sensor of FIG. 1, and/or relative to an axis (e.g., the PDAF axis 148 of FIG. 1) that is normal to sensing surfaces 124 of pixel sensors 114, 116 in FIG. 1. The ARCs 202, 204 comprise a PDAF ARC 202 corresponding to the PDAF pixel 102 of FIG. 1, and an image capture ARC 204 corresponding to the image capture pixel 104 of FIG. 1.

As illustrated by the ARCs 202, 204, the PDAF pixel 102 is sensitive to a smaller range of incident angles than the image capture pixel 104. For example, the PDAF ARC 202 may have a PDAF ARC width $CW_{AF}$, such as a full width at half maximum (FWHM) or a bottom width, that is smaller than a corresponding image capture ARC width $CW_{IC}$ of the image capture ARC 204. Further, the PDAF pixel 102 has an incident angle of peak sensitivity that is laterally shifted from an incident angle of peak sensitivity for the image capture pixel 104. For example, the PDAF ARC 202 has a PDAF peak $P_{AF}$ that is laterally offset from an image capture peak $P_{IC}$ of the image capture ARC 204 by an offset O. The smaller range of incident angles and/or the lateral offset O allow angular response discrimination for PDAF.

In some embodiments, the PDAF ARC width $CW_{AF}$ is small and/or sensitivity at the PDAF peak $P_{AF}$ is high due to the PDAF microlens 140 of FIG. 1. In other words, in some embodiments, the PDAF ARC 202 is steep due to the PDAF microlens 140 of FIG. 1. Further, in some embodiments, the offset O between the PDAF peak $P_{AF}$ and the image capture peak $P_{IC}$ is large due to the PDAF microlens 140 of FIG. 1. The steep PDAF ARC 202 and/or the large offset O advantageously allow the PDAF pixel 102 to achieve good angular response discrimination for PDAF.

With reference to FIGS. 3A-3E, cross-sectional views 300A-300E of various embodiments of pixels are provided.

Figure 3A:
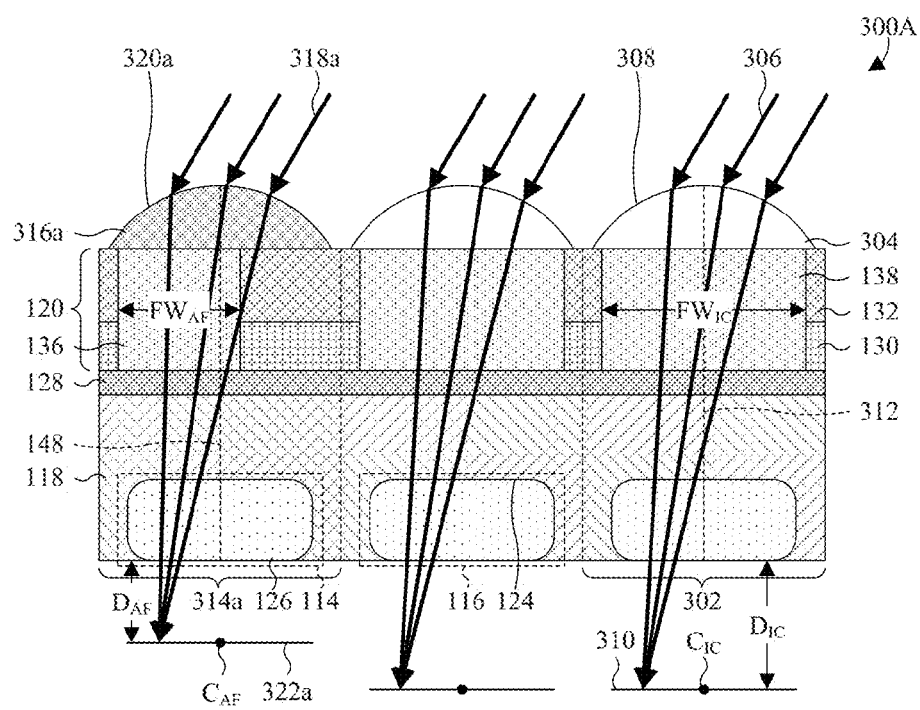
FIG. 3A illustrates a cross-sectional view of some embodiments of the PDAF pixel with a high-n microlens.

As illustrated by FIG. 3A, an image capture pixel 302 comprises an image capture microlens 304 configured to receive radiation 306 at an image capture receiving surface 308, and to focus the radiation 306 on an image capture focal plane 310 (partially shown) arranged an image capture distance $D_{IC}$ from pixel sensors 114, 116. In some embodiments, the image capture microlens 304 is a plano-convex lens. Centers $C_{IC}$ (e.g., centroids) of the image capture microlens 304, the image capture focal plane 310, and the image capture receiving surface 308 are arranged at an image capture axis 312 that is normal to sensing surfaces 124 of the pixel sensors 114, 116. The image capture axis 312 may, for example, be arranged at a center (e.g., a centroid) of a pixel sensor of the image capture pixel 302.

Also illustrated by FIG. 3A, a PDAF pixel 314a comprises a high-n PDAF microlens 316a configured to receive radiation 318a at a PDAF receiving surface 320a, and to focus the radiation 318a on a PDAF focal plane 322a (partially shown) arranged a PDAF distance $D_{AF}$ from the pixel sensors 114, 116. In some embodiments, the high-n PDAF microlens 316a is a plano-convex lens, and/or shares a size with the image capture microlens 304. Centers $C_{AF}$ (e.g., centroids) of the high-n PDAF microlens 316a, the PDAF focal plane 322a, and the PDAF receiving surface 320a are arranged at a PDAF axis 148 normal to the sensing surfaces 124.

The high-n PDAF microlens 316a has a refractive index larger than a refractive index of the image capture microlens 304, such that an optical power of the high-n PDAF microlens 316a is larger than an optical power of the image capture microlens 304. Due to the larger optical power, the PDAF distance $D_{AF}$ is less than the image capture distance $D_{IC}$. The smaller PDAF distance $D_{AF}$ results in high sensitivity within a range of incident angles and/or sensitivity restricted to a small range of incident angles. Further, the smaller PDAF distance $D_{AF}$ results in good angular response discrimination for PDAF.

Figure 3B:
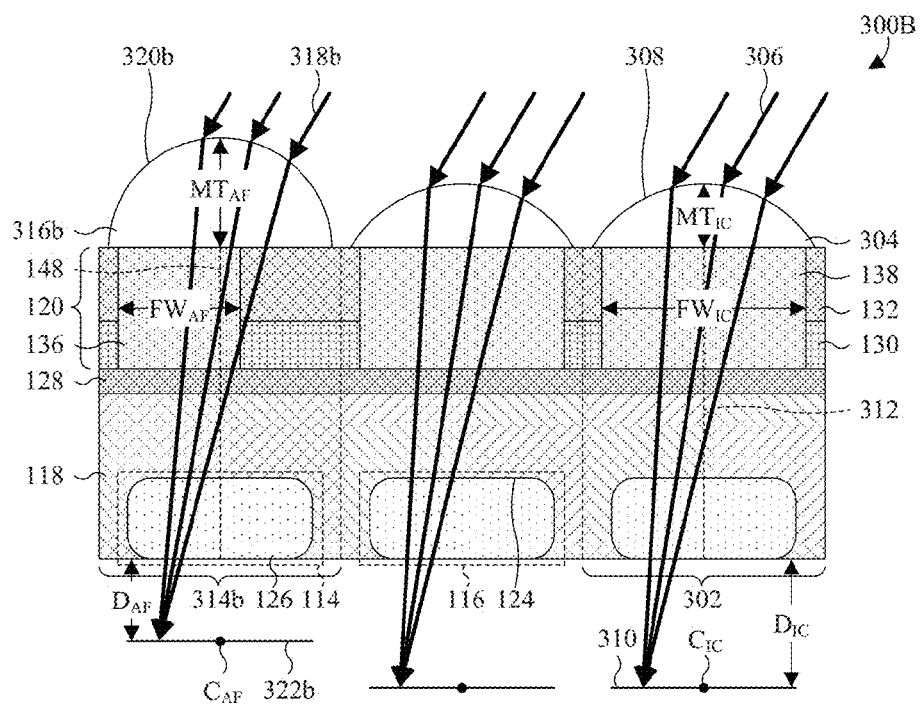
FIG. 3B illustrates a cross-sectional view of some embodiments of the PDAF pixel with a thick microlens.

As illustrated by FIG. 3B, a PDAF pixel 314b comprises a thick PDAF microlens 316b configured to receive radiation 318b at a PDAF receiving surface 320b, and to focus the radiation 318b on a PDAF focal plane 322b (partially shown) arranged a PDAF distance $D_{AF}$ from pixel sensors 114, 116. In some embodiments, the thick PDAF microlens 316b is a plano-convex lens. Centers $C_{AF}$ (e.g., centroids) of the thick PDAF microlens 316b, the PDAF focal plane 322b, and the PDAF receiving surface 320b are arranged at a PDAF axis 148 that is normal to sensing surfaces 124 of the pixel sensors 114, 116.

The thick PDAF microlens 316b has a PDAF thickness $MT_{AF}$ larger than an image capture thickness $MT_{IC}$ of an image capture microlens 304. The larger PDAF thickness $MT_{AF}$ results in a smaller radius of curvature (ROC) than an ROC of the image capture microlens 304, such that optical power of the thick PDAF microlens 316b is larger than an optical power of the image capture microlens 304. Due to the larger optical power, the PDAF distance $D_{AF}$ is less than an image capture distance $D_{IC}$ between the pixel sensors 114, 116 and an image capture focal plane 310. The smaller PDAF distance $D_{AF}$ results in high sensitivity within a range of incident angles and/or sensitivity restricted to a small range of incident angles. Further, the smaller PDAF distance $D_{AF}$ results in good angular response discrimination for PDAF.

Figure 3C:
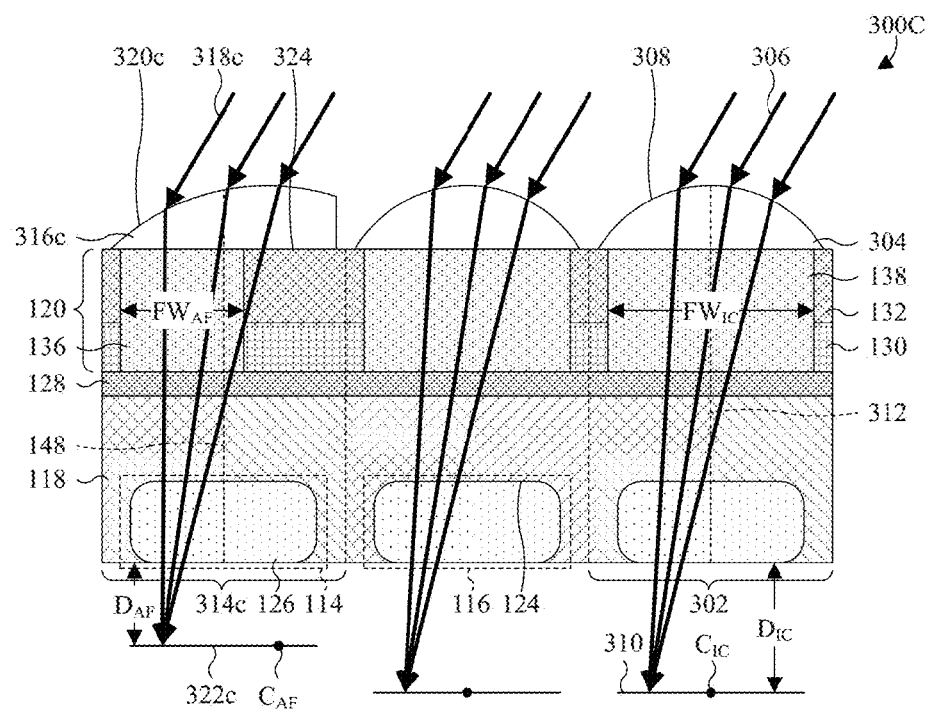
FIG. 3C illustrates a cross-sectional view of some embodiments of the PDAF pixel with an asymmetric microlens.

As illustrated by FIG. 3C, a PDAF pixel 314c comprises an asymmetric PDAF microlens 316c configured to receive radiation 318c at a PDAF receiving surface 320c, and to focus the radiation 318c on a PDAF focal plane 322c (partially shown) arranged a PDAF distance $D_{AF}$ from pixel sensors 114, 116. The asymmetric PDAF microlens 316c and the PDAF receiving surface 320c have asymmetric profiles about a PDAF axis 148 that is normal to sensing surfaces 124 of the pixel sensors 114, 116. Further, in some embodiments, the asymmetric PDAF microlens 316c is a subset of a plano-convex lens that is arranged on a side of a plane intersecting the plano-convex lens normal to a planar lower surface 324 of the plano-convex lens and normal to a width of the plano-convex lens. The side may be, for example, closest to a PDAF color filter 136 of the PDAF pixel 314c.

Due to the asymmetric profiles of the asymmetric PDAF microlens 316c and the PDAF receiving surface 320c, centers (e.g., widthwise centers) of the PDAF microlens 316c and/or the PDAF receiving surface 320c are arranged at the PDAF axis 148, whereas a center $C_{AF}$ of the PDAF focal plane 322c is laterally offset from the PDAF axis 148. In some embodiments, the center $C_{AF}$ of the PDAF focal plane 322c is a widthwise center or a focal point for incident angles of zero. Further, in some embodiments, the center $C_{AF}$ of the PDAF focal plane 322c is laterally offset away from the PDAF color filter 136. The lateral offset results in a large distance between incident angles of peak sensitivity for the PDAF pixel 314c and an image capture pixel 302. This, in turn, results in good angular response discrimination for PDAF.

Further, in some embodiments, the PDAF distance $D_{AF}$ is less than an image capture distance $D_{IC}$ between the pixel sensors 114, 116 and an image capture focal plane 310 due to the asymmetric profiles of the asymmetric PDAF microlens 316c and the PDAF receiving surface 320c. The smaller PDAF distance $D_{AF}$ results in high sensitivity within a range of incident angles and/or sensitivity restricted to a small range of incident angles. Even more, in some embodiments, the angular response curve is asymmetric about a peak. The foregoing may further result in good angular response discrimination for PDAF.

Thus far, from FIG. 3A to FIG. 3C, PDAF receiving surfaces 320a-c have been defined substantially (e.g., 75%, 85%, 90%, or 95%) by upper surfaces of corresponding PDAF microlenses 316a-c. As such, light collection efficiency across the PDAF receiving surfaces 320a-c has been high and/or substantially uniform. However, as seen hereafter in FIGS. 3D & E, in some embodiments, a PDAF receiving surface may be larger (e.g., 1.5, 2, or 2.5 times larger) than an upper surface of a PDAF microlens. In such embodiments, light collection efficiency on a region of the PDAF receiving surface corresponding to an upper surface of the PDAF microlens is substantially higher than other regions of the PDAF receiving surface.

Figure 3D:
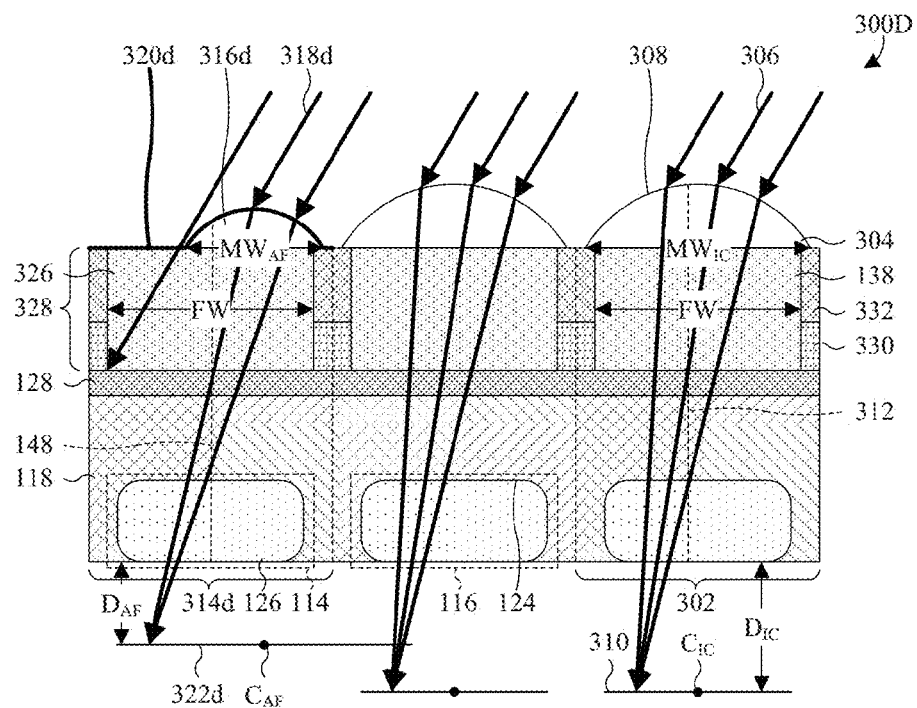
FIG. 3D illustrates a cross-sectional view of some embodiments of the PDAF pixel with a small microlens.

As illustrated by FIG. 3D, a PDAF pixel 314d comprises a small PDAF microlens 316d arranged over a PDAF color filter 326 and a grid structure 328. In some embodiments, the PDAF color filter 326 shares substantially the same width FW as an image capture color filter 138. Further, in some embodiments, the grid structure 328 comprises a metal grid structure 330 and a dielectric grid structure 332. The small PDAF microlens 316d is configured to receive radiation 318d at a PDAF receiving surface 320d, and to focus the radiation 318d on a PDAF focal plane 322d (partially shown) arranged a PDAF distance $D_{AF}$ from pixel sensors 114, 116. In some embodiments, the small PDAF microlens 316d is a plano-convex lens. A center (e.g., a widthwise center) of the PDAF receiving surface 320d is arranged at a PDAF axis 148 that is normal to sensing surfaces 124 of the pixel sensors 114, 116.

The small PDAF microlens 316d has a PDAF microlens width $MW_{AF}$ smaller than an image capture microlens width $MW_{IC}$ of an image capture microlens 304. Further, the smaller PDAF microlens width $MW_{AF}$ results in a smaller ROC than an ROC of the image capture microlens 304. Centers $C_{AF}$ (e.g., centroids) of the PDAF microlens 316d and/or the PDAF focal plane 322d are laterally offset from the PDAF axis 148. The offset is to a first side of the PDAF pixel 314d, closer to the first side than a second side of the PDAF pixel 314d that is opposite the first side. Due to the offset, the PDAF receiving surface 320d is asymmetric about the PDAF axis 148, and a distance between incident angles of peak sensitivity for the PDAF pixel 314d and an image capture pixel 302 is large. Further, in some embodiments, an angular response curve of the PDAF pixel 314d is asymmetric about a peak. The foregoing advantageously result in good angular response discrimination for PDAF.

Figure 3E:
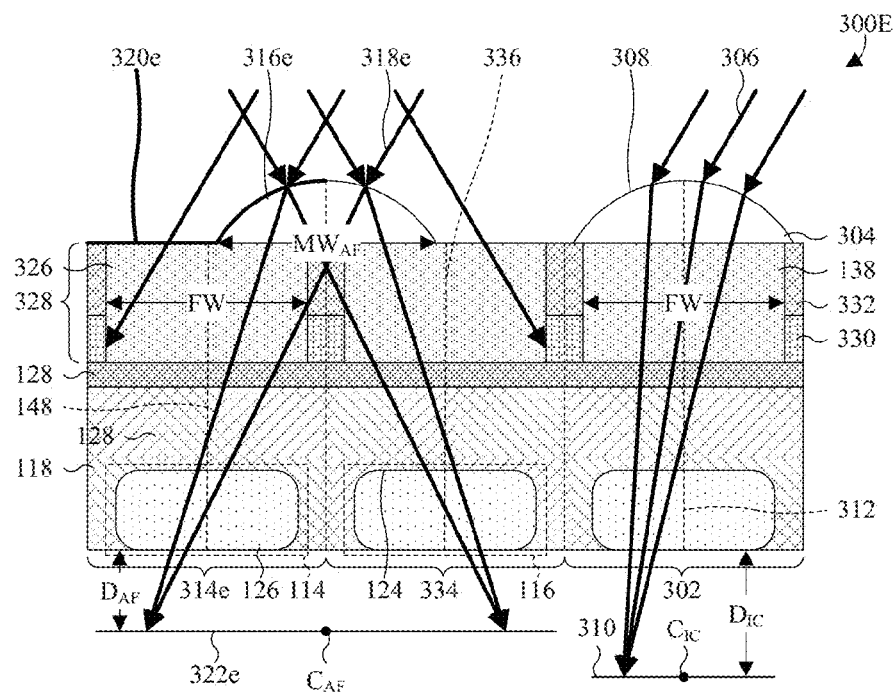
FIG. 3E illustrates a cross-sectional view of some embodiments of the PDAF pixel with a shared microlens.

As illustrated by FIG. 3E, two PDAF pixels 314e, 334 receive radiation at corresponding PDAF receiving surfaces 320e, and comprise a shared PDAF microlens 316e arranged over corresponding PDAF color filters 326. The shared PDAF microlens 316e is configured to receive radiation 318e at the PDAF receiving surfaces 320e, and to focus the radiation 318e on a PDAF focal plane 322e (partially shown) arranged a PDAF distance $D_{AF}$ from pixel sensors 114, 116. In some embodiments, the shared PDAF microlens 316e is a plano-convex lens, and/or shares a size or shape with an image capture microlens 304. Centers $C_{AF}$ (e.g., widthwise centers) of the PDAF receiving surfaces are arranged at corresponding PDAF axes 148, 336 that are normal to sensing surfaces 124 of the pixel sensors 114, 116. The axes 148, 336 may, for example, be arranged at centers (e.g., centroids) of corresponding pixel sensors 114, 116.

The shared PDAF microlens 316e has a PDAF microlens width $MW_{AF}$ split between the PDAF pixels 314e, 334. Centers $C_{AF}$ (e.g., centroids) of the shared PDAF microlens 316e and the PDAF focal plane 322e are laterally offset from the PDAF axes 148, 336 to a point intermediate the PDAF axes 148, 336, such as a point equidistant from the axes 148, 336. Due to the offset, the PDAF receiving surfaces 320e are asymmetric about the PDAF axes 148, 336, and a distance between incident angles of peak sensitivity for the PDAF pixels 314e, 334 is large. Further, in some embodiments, angular response curves of the PDAF pixels 314e, 334 are asymmetric about a peak. The foregoing advantageously result in good angular response discrimination for PDAF.

Figure 4:
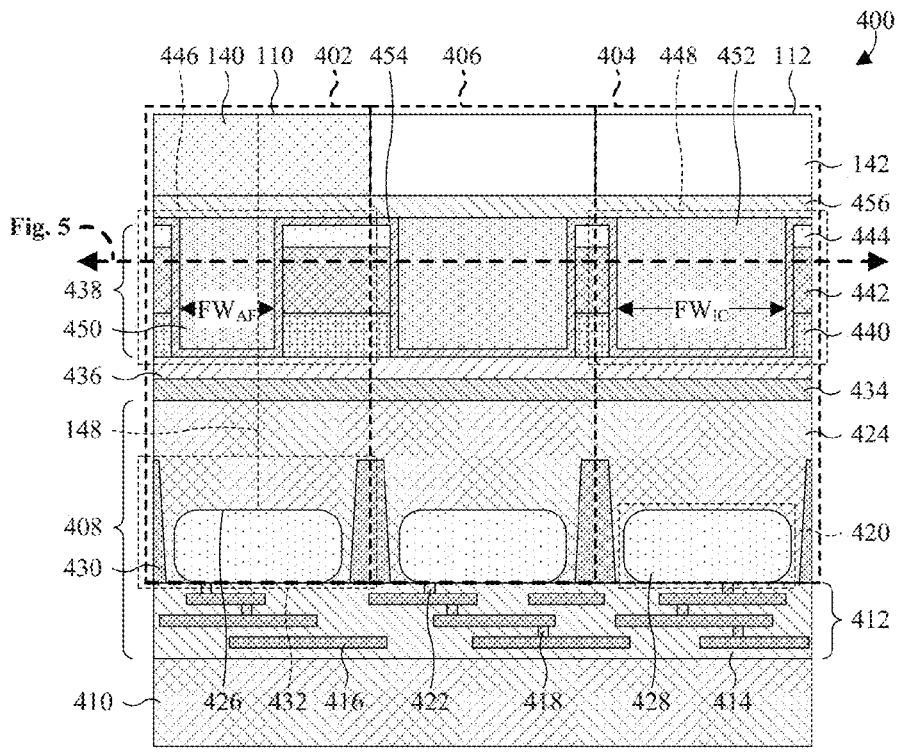
FIG. 4 illustrates a cross-sectional view of more detailed embodiments of the BSI image sensor.

With reference to FIG. 4, a cross-sectional view 400 of more detailed embodiments of the BSI image sensor is provided. As illustrated, pixels 402, 404, 406 are arranged on a backside of an IC 408, and sensitive to incident radiation on corresponding receiving surfaces 110, 112. The receiving surfaces 110, 112 may, for example, correspond to regions of a radiation receiving surface (e.g., an upper surface) of the BSI image sensor that are delineated by boundaries or interfaces of the pixels 402, 404, 406. Further, the receiving surfaces 110, 112 include regions of high light collection efficiency (e.g., corresponding to upper surfaces of microlenses) and, in some embodiments, regions of comparatively low light collection efficiency (e.g., corresponding to upper surface regions uncovered by microlenses). The pixels 402, 404, 406 comprise a PDAF pixel 402, an image capture pixel 404, and a floating pixel 406. The PDAF pixel 402 is configured for PDAF, whereas the image capture pixel 404 is configured for capturing an image of an object. The floating pixel 406 may be configured according to the image capture pixel 404 in some embodiments, and configured according to the PDAF pixel 402 in other embodiments.

The IC 408 is arranged over a carrier substrate 410 and bonded to the carrier substrate 410 through a back end of line (BEOL) stack 412 of the IC 408 that is arranged on a frontside of the IC 408, opposite the backside. The carrier substrate 410 may be, for example, a bulk semiconductor substrate, such as a bulk silicon substrate. The BEOL stack 412 is arranged over the carrier substrate 410, and includes an ILD layer 414 and metallization layers 416 stacked within the ILD layer 414. The ILD layer 414 may be, for example, a low κ dielectric (i.e., a dielectric with a dielectric constant κ less than about 3.9) or an oxide. The metallization layers 416 are electrically coupled to one another by vias 418, and electrically coupled to overlying pixel sensors 420 by contacts 422. The metallization layers 416, the vias 418, and the contacts 422 may be, for example, a metal, such as aluminum copper or copper.

The pixel sensors 420 correspond to the pixels 402, 404, 406, and are arranged within a semiconductor substrate 424 of the IC 408. The semiconductor substrate 424 may be, for example, a bulk semiconductor substrate, such as a bulk silicon substrate. The pixel sensors 420 are configured to measure the intensity of radiation incident on corresponding sensing surfaces 426 and, in some embodiments, to facilitate readout of the measured incident radiation. For example, the pixel sensors 420 may comprise transistors (not shown) to facilitate readout, and/or photodiodes 428 to measure the intensity of incident radiation. The pixel sensors 420 may be, for example, charge coupled device (CCD) pixel sensors or active pixel sensors (APSs).

An electrical isolation grid structure 430 is arranged within the semiconductor substrate 424 and configured to electrically isolate the pixel sensors 420 from one another. The electrical isolation grid structure 430 comprises a plurality of electrical isolation grid segments 432 (i.e., regions) corresponding to the pixels 402, 404, 406. The electrical isolation grid segments 432 laterally surround the pixel sensors 420 of the corresponding pixels 402, 404, 406. Further, in some embodiments, the electrical isolation grid segments 432 abut at interfaces between the pixels 402, 404, 406. The electrical isolation grid structure 430 may be, for example, a shallow trench isolation (STI) region or an implant isolation region.

An antireflective layer 434 and/or a first buffer layer 436 are arranged over the semiconductor substrate 424. For example, the antireflective layer 434 and the first buffer layer 436 may be stacked over the semiconductor substrate 424 with the first buffer layer 436 overlying the antireflective layer 434. The antireflective layer 434 may be, for example, an organic polymer or a metallic oxide. The first buffer layer 436 may be, for example, an oxide, such as silicon dioxide.

An optical isolation grid structure 438 is arranged over the antireflective layer 434 and/or a first buffer layer 436, and configured to optically isolate the pixel sensors 420 from one another and/or to guide radiation to the pixel sensors 420. In some embodiments, the optical isolation grid structure 438 is metal. In other embodiments, the optical isolation grid structure 438 is a composite of multiple grid structures 440, 442, 444. For example, the optical isolation grid structure 438 may comprise a metal grid structure 440 and a dielectric grid structure 442 arranged over the metal grid structure 440. As another example, the optical isolation grid structure 438 may comprise the metal grid structure 440 and the dielectric grid structure 442, as well as a hard mask grid structure 444 arranged over the dielectric grid structure 442. The dielectric grid structure 442 may be, for example, oxide, such as silicon dioxide. The metal grid structure 440 may be, for example, tungsten. The hard mask grid structure 444 may be, for example, silicon nitride.

A plurality of optical isolation grid segments 446, 448 (i.e., regions) of the optical isolation grid structure 438 laterally surround color filters 450, 452 of corresponding pixels 402, 404, 406. In some embodiments, the optical isolation grid segments 446, 448 abut at the interfaces between the pixels 402, 404, 406 and/or share a common footprint. Further, in some embodiments, the optical isolation grid segments 446, 448 are lined by a liner layer 454 to space the color filters 450, 452 from the grid segments 446, 448. The liner layer 454 may be, for example, a dielectric, such as silicon dioxide or some other oxide.

The color filters 450, 452 are configured to transmit assigned colors or wavelength of radiation to the pixel sensors 420, while filtering out (e.g., blocking) unassigned colors or wavelengths of radiation. In some embodiments, the color filter assignments alternate according to a Bayer mosaic. An image capture color filter 452 of the image capture pixel 404 has an image capture filter width $FW_{IC}$, and a PDAF color filter 450 of the PDAF pixel 402 has a PDAF color filter width $FW_{AF}$. In some embodiments, the PDAF color filter width $FW_{AF}$ is less than the image capture filter width $FW_{IC}$, and the PDAF color filter 450 is laterally shifted to a first side of the corresponding optical isolation grid segment 446, closer to the first side than a second side of the corresponding optical isolation grid segment 446 that is opposite the first side. In other embodiments, the PDAF filter width $FW_{AF}$ and the image capture filter width $FW_{IC}$ are substantially the same.

Microlenses 140, 142 corresponding to the pixels 402, 404, 406 are arranged over the color filters 450, 452, and spaced from the color filters 450, 452 by a second buffer layer 456. In some embodiments, the microlenses 140, 142 and/or the second buffer layer 456 are the same material, such as a resin. The microlenses 140, 142 are configured to focus incident radiation towards the pixel sensors 420, and comprise a PDAF microlens 140 of the PDAF pixel 402 and an image capture microlens 142 of the image capture pixel 404. In some embodiments, the PDAF and/or the image capture microlenses 140, 142 are configured according to one of FIGS. 3A-E, whereby the floating pixel 406 may be configured for image capture or PDAF depending upon the one of FIGS. 3A-E.

The PDAF microlens 140 has an optical power larger than an optical power of the image capture microlens 142, and/or has a shape or location so a PDAF receiving surface 110 of the PDAF pixel 102 has an asymmetric profile about a PDAF axis 148 normal to the sensing surfaces 426. The former may, for example, shift a PDAF focal plane of the PDAF pixel closer to the pixel sensors 420 than an image capture focal plane of the image capture microlens 142. The latter may, for example, laterally shift a center of the PDAF focal plane (e.g., a convergence point for radiation with an incident angle of zero relative to an axis normal to the sensing surfaces 426) from a center of a PDAF pixel sensor of the PDAF pixel 402 (e.g., a centroid) by a first shift amount. The first shift amount may exceed a second shift amount between a center of the image capture focal plane and a center of an image capture pixel sensor of the image capture pixel 404. The larger optical power and/or the asymmetric profile advantageously achieves good angular response discrimination by high sensitivity within a range of incident angles, sensitivity restricted to a small range of incident angles, and/or a large distance between incident angles of peak sensitivity for the PDAF pixel 402 and the image capture pixel 404.

Figure 5:
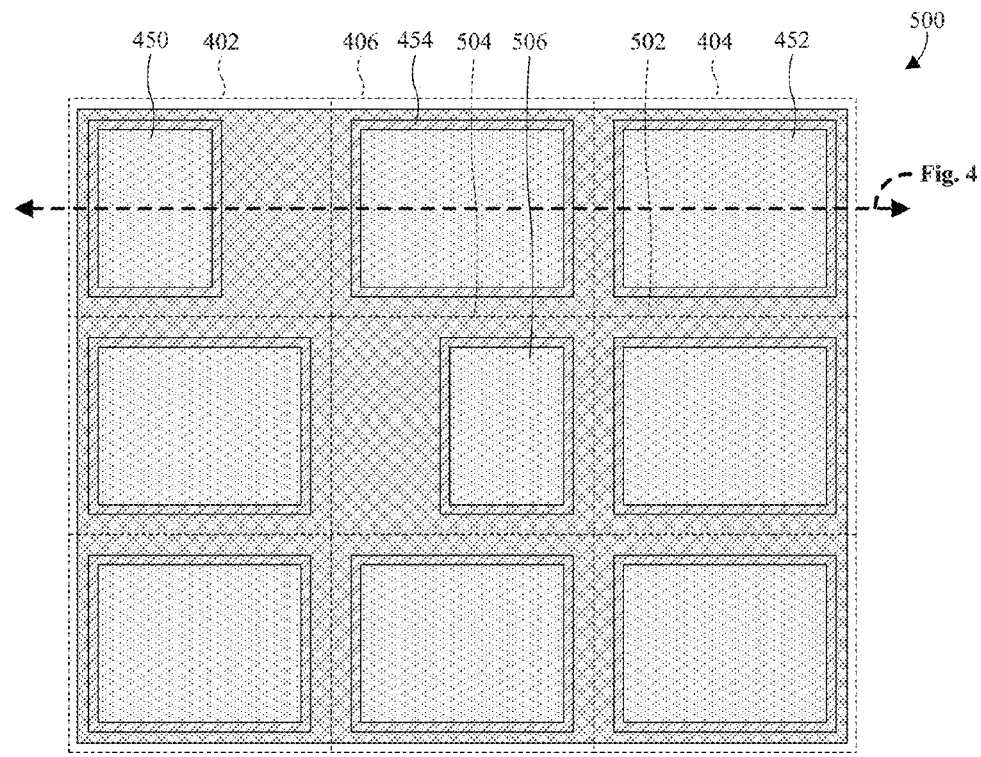
FIG. 5 illustrates a top view of some embodiments of the BSI image sensor of FIG. 4.

With reference to FIG. 5, a top view 500 of some embodiments of the BSI image sensor of FIG. 4 is provided. The BSI image sensor comprises an array of pixels 402, 404, 406, 502, 504 arranged in rows and columns. The array of pixels 402, 404, 406, 502, 504 comprises multiple image capture pixels 404, 502 configured according to the image capture pixel 404 of FIG. 4, and further comprises a pair of PDAF pixels 402, 504.

The PDAF pixels 402, 504 are configured according to the PDAF pixel 402 of FIG. 4, except that the PDAF pixels 402, 504 are typically mirror images of one another. For example, where the PDAF pixels 402, 504 comprise microlenses (not shown) according to the embodiments of FIGS. 3A-C, the corresponding color filters 450, 506 are arranged on opposite sides of the corresponding pixels 402, 504 (i.e., the color filters 450, 506 are offset to sides of the pixels 402, 504 in opposite directions). As another example, where the PDAF pixels 402, 504 comprise microlenses (not shown) according to the embodiments of FIG. 3D, the corresponding microlenses are arranged on opposite sides of the corresponding pixels 402, 504. In some embodiments, the PDAF pixels 402, 504 are diagonally opposite from one another. In other embodiments, the PDAF pixels 402, 504 share a row or a column.

Figure 6:
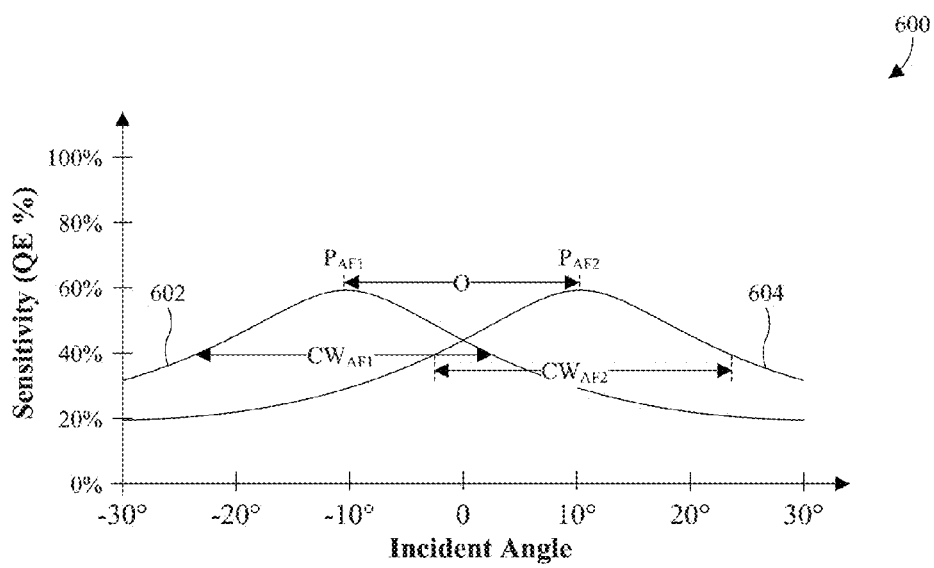
FIG. 6 illustrates a graph of some embodiments of ARCs for a pair of PDAF pixels in FIG. 5.

With reference to FIG. 6, a graph 600 illustrates some embodiments of PDAF ARCs 602, 604 corresponding to the PDAF pixels 402, 504 of FIG. 5. As illustrated by the PDAF ARCs 602, 604, the PDAF pixels 402, 504 are sensitive within corresponding ranges of incident angles, and have peaks $P_{AF1}$, $P_{AF2}$ laterally spaced from one another by an offset O. In some embodiments, widths $CW_{AF1}$, $CW_{AF2}$, such as bottom widths or FWHMs, of the PDAF ARCs are small and/or sensitivities at the peaks $P_{AF1}$, $P_{AF2}$ are high due to the PDAF microlens 140 of FIG. 4. In other words, in some embodiments, the PDAF ARCs 602, 604 are steep due to the PDAF microlens 140 of FIG. 4. Further, in some embodiments, the offset O between the peaks $P_{AF1}$, $P_{AF2}$ is large due to the PDAF microlens 140 of FIG. 4. The steep PDAF ARCs 602, 604 and/or the large offset O between peaks $P_{AF1}$, $P_{AF2}$ advantageously allow the PDAF pixels 402, 504 to achieve good angular response discrimination for PDAF.

With reference to FIGS. 7-11, cross-sectional views 700-1100 of some embodiments of the BSI image sensor of FIG. 4 at various stages of manufacture are provided.

Figure 7:
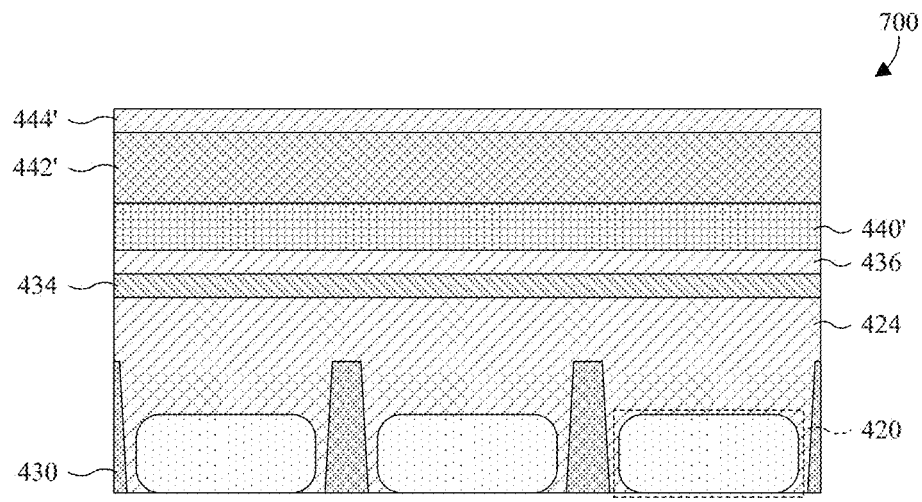
FIGS. 7-11, 12A-12C, 13A & 13B, 14A-14E, and 15A & 15B illustrate cross-sectional views of some embodiments of a BSI image sensor at various stages of manufacture.

As illustrated by FIG. 7, pixel sensors 420 corresponding to pixels under manufacture are arranged in a semiconductor substrate 424 and laterally surrounded by an electrical isolation grid structure 430 arranged in the semiconductor substrate 424. In some embodiments, the semiconductor substrate 424 is part of an IC and arranged on a backside of the IC.

Also illustrated by FIG. 7, an antireflective layer 434 and/or a first buffer layer 436 are formed over the semiconductor substrate 424. For example, the first buffer layer 436 may be formed overlying the antireflective layer 434. Further, one or more grid layers 440', 442', 444' are formed over the antireflective layer 434 and/or the first buffer layer 436. For example, the grid layer(s) 440', 442', 444' may be restricted to a metal grid layer 440'. As another example, the grid layer(s) may comprise the metal grid layer 440' and a dielectric grid layer 442' overlying the metallic grid layer 440'. As yet another example, the grid layer(s) 440', 442', 444' may comprise the metal grid layer 440', the dielectric grid layer 442', and a hard mask grid layer 444' overlying the dielectric grid layer 442'. In some embodiments, the antireflective layer 434 and/or the first buffer layer 436, as well as the grid layer(s) 440', 442', 444', are sequentially formed using one or more of vapor deposition (e.g., chemical vapor deposition (CVD)), thermal oxidation, spin coating, and the like.

Figure 8:
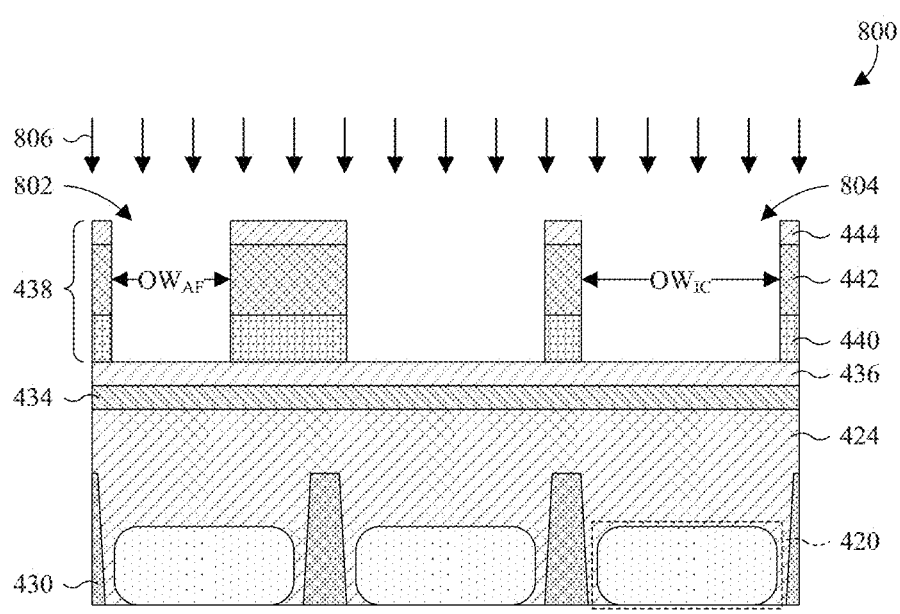

As illustrated by FIG. 8, a first etch is performed into the grid layer(s) 440', 442', 444' (see FIG. 7) to form an optical isolation grid structure 438 comprising one or more of a metal grid structure 440, a dielectric grid structure 442, and a hard mask grid structure 444. The optical isolation grid structure 438 laterally surrounds openings 802, 804 corresponding to the pixels under manufacture. In some embodiments, a PDAF opening 802 of a PDAF pixel under manufacture has a width $OW_{AF}$ less than a width $OW_{IC}$ of an image capture opening 804 for an image capture pixel under manufacture.

The process for performing the first etch may include forming a photoresist layer (not shown) masking regions of the grid layer(s) 440', 442', 444' corresponding to the optical isolation grid structure 438. One or more etchants 806 may then be sequentially applied to the grid layer(s) 440', 442', 444' to define the grid structure 438. In some embodiments, after the grid structure 438 is fully defined, the photoresist layer is removed. In other embodiments, after the hard mask grid structure 444 is defined, but before etching other grid layers (e.g., the dielectric grid layer 442'), the photoresist layer is removed.

Figure 9:
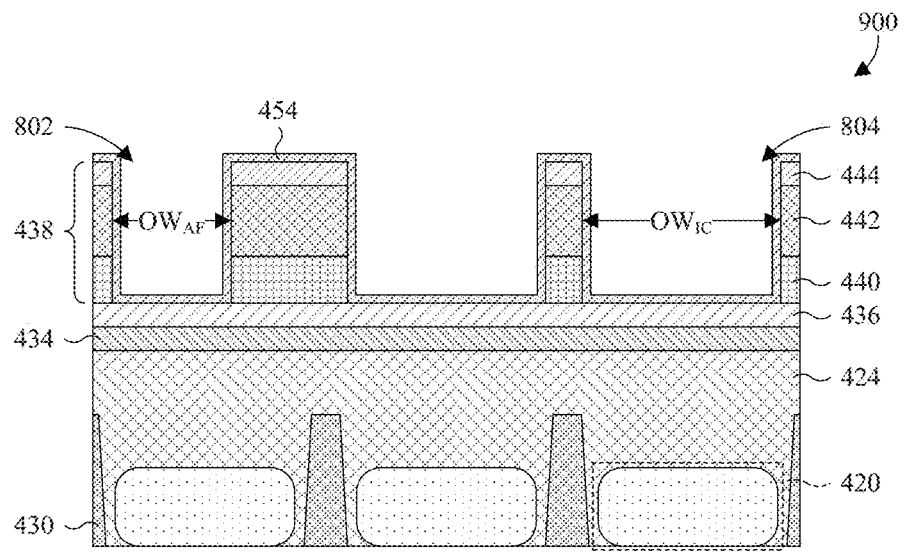

As illustrated by FIG. 9, in some embodiments, the openings 802, 804 in the optical isolation grid structure 438 are lined by a liner layer 454. In some embodiments, the liner layer 454 is formed using vapor deposition and/or thermal oxidation.

Figure 10:
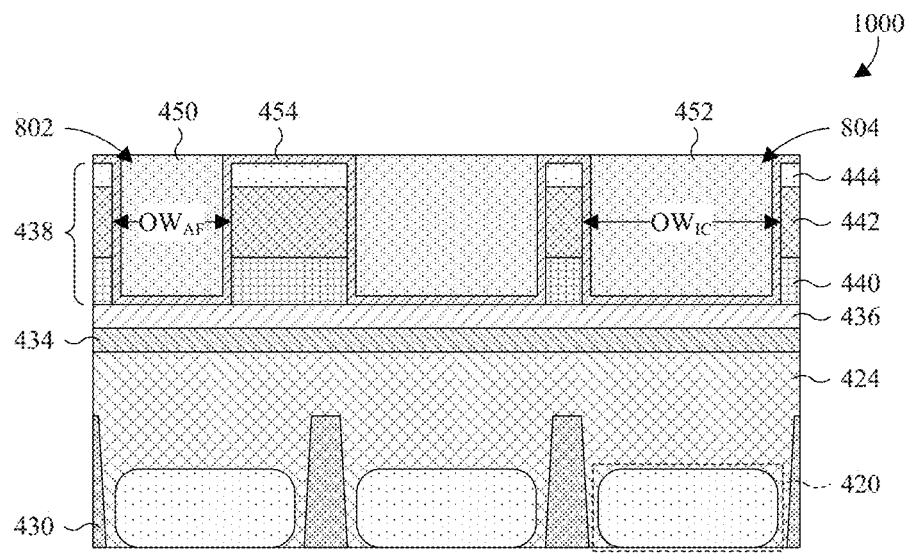

As illustrated by FIG. 10, color filters 450, 452 corresponding to the pixel sensors under manufacture are formed in the openings 802, 804. In some embodiments, the color filters 450, 452 fill the openings 802, 804 with upper surfaces approximately even with an upper surface of the optical isolation grid structure 438 and/or the liner layer 454. The color filters 450, 452 are typically assigned colors, such as red, green, and blue, and configured to transmit the assigned colors while blocking other colors.

The process for forming the color filters 450, 452 may include, for each of the color assignments, forming a color filter layer and patterning the color filter layer. The color filter layer may be formed so as to fill the openings 802, 804 and to cover the optical isolation grid structure 438. The color filter layer may then be planarized and/or etched back to approximately even an upper surface of the optical isolation grid structure 438 and/or the liner layer 454, before patterning the color filter layer.

Figure 11:
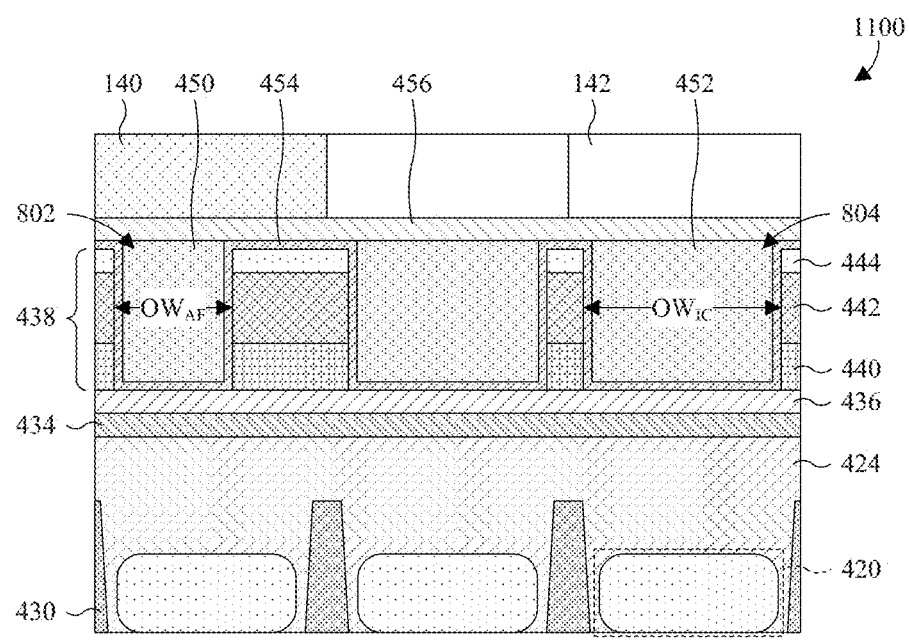

As illustrated by FIG. 11, a second buffer layer 456 is formed over the color filters 450, 452, and microlenses 140, 142 are formed over the second buffer layer 456. The second buffer layer 456 may be formed by, for example, one or more of vapor deposition, atomic layer deposition (ALD), spin coating, and the like.

The process for forming the microlenses 140, 142 varies depending upon the configurations of the microlenses 140, 142 (see, e.g., the configurations of FIGS. 3A-E). However, the process may comprise forming one or more microlens layers over the second buffer layer 456. The microlens layer(s) may be, for example, formed of the same material as the second buffer layer 456 and/or formed using, for example, one or more of vapor deposition, ALD, spin coating, and the like. After forming a microlens layer, the microlens layer is patterned to define footprints of corresponding microlenses. For example, a photoresist layer masking select regions of the microlens layer may be formed over the microlens layer, used as a mask during an etch of the microlens layer, and subsequently removed. With the microlens layer patterned, one or more reflow and/or heating processes are performed on the patterned microlens layer to round corners of the patterned microlens layer.

Figure 12A:
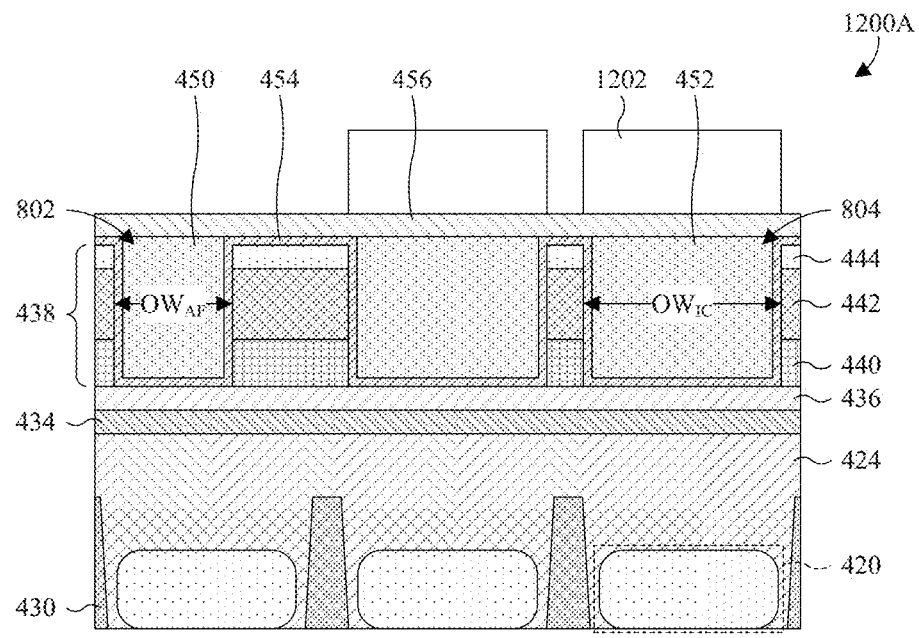
Figure 12B:
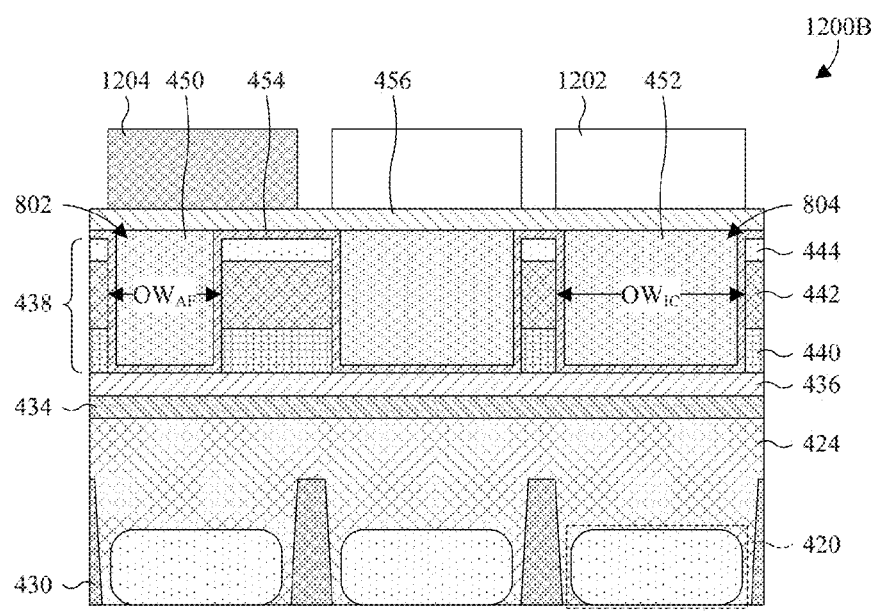
Figure 12C:
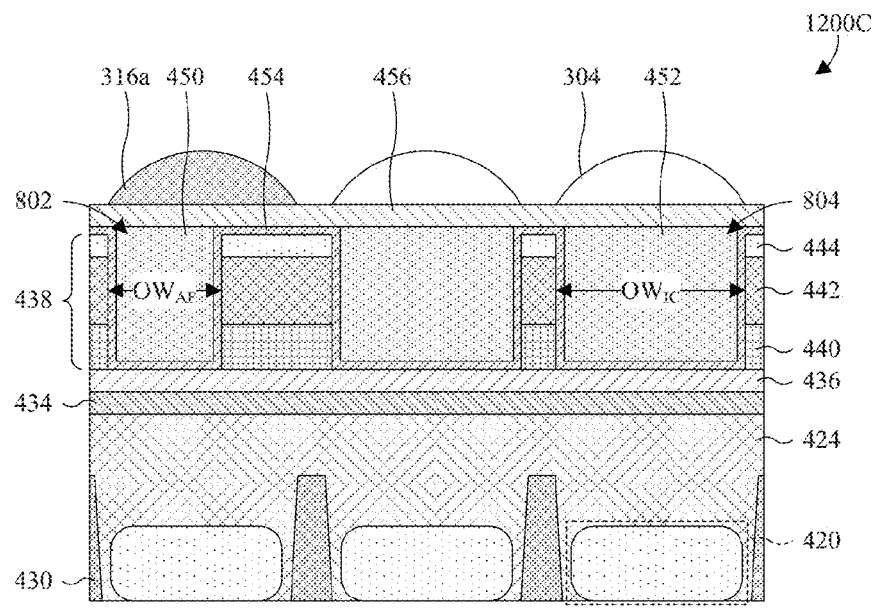

With reference to FIGS. 12A-12C, cross-sectional views 1200A-1200C of some embodiments of the microlenses 140, 142 of FIG. 11 at various stages of manufacture are provided. These embodiments may, for example, be used when the microlenses 140, 142 of FIG. 11 are configured according to the microlenses 304, 316a of FIG. 3A.

As illustrated by FIG. 12A, an image capture microlens layer is formed and patterned to define an image capture element 1202 corresponding to an image capture microlens under manufacture. In some embodiments, the image capture element 1202 is square or rectangular, and/or has a footprint of the image capture microlens under manufacture.

As illustrated by FIG. 12B, a PDAF microlens layer is formed with a higher refractive index than the image capture element 1202. Further, the PDAF microlens layer is patterned to define a PDAF element 1204 corresponding to a PDAF microlens under manufacture. As with the image capture element 1202, in some embodiments, the PDAF element 1204 is square or rectangular, and/or has footprints of the PDAF microlens under manufacture.

As illustrated by FIG. 12C, the image capture and PDAF elements 1202, 1204 (see FIG. 12B) undergo one or more reflow and/or heating processes to round corners and to form corresponding microlenses 304, 316a.

Figure 13A:
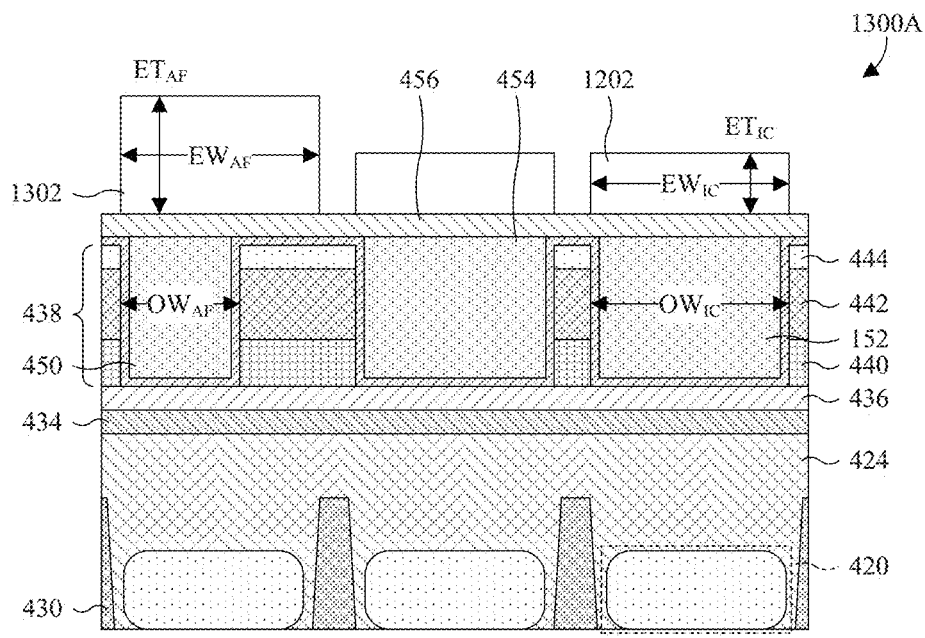
Figure 13B:
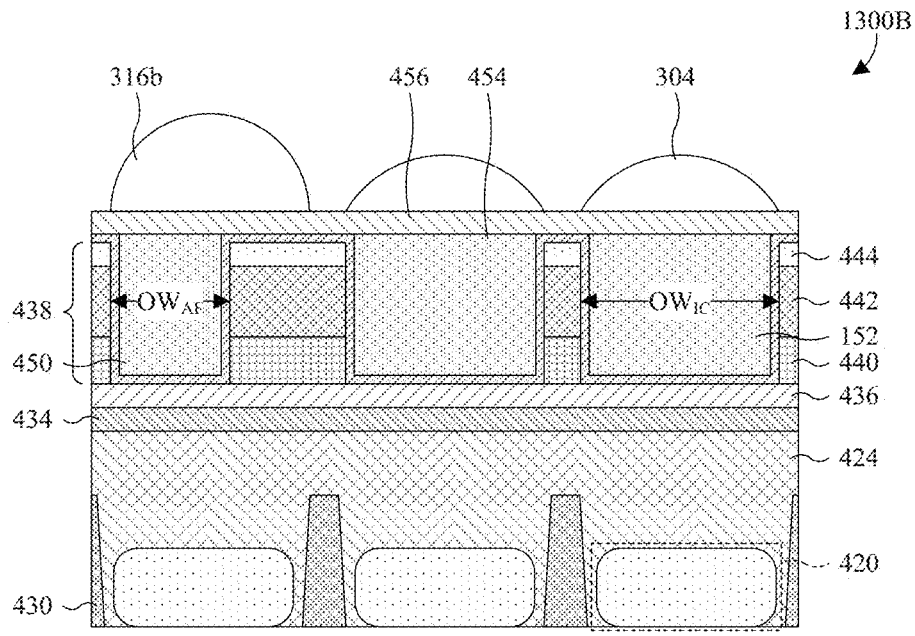

With reference to FIGS. 13A and 13B, cross-sectional views 1300A and 1300B of some embodiments of the microlenses 140, 142 of FIG. 11 at various stages of manufacture are provided. These embodiments may, for example, be used when the microlenses 140, 142 of FIG. 11 are configured according to the microlenses 304, 316b, 316d, 316e of FIG. 3B, 3D, or 3E, but are illustrated with the configuration of FIG. 3B.

As illustrated by FIG. 13A, an image capture microlens layer is formed and patterned to define elements 1202, 1302 corresponding to microlenses under manufacture. In some embodiments, the elements 1202, 1302 are square or rectangular, and/or have footprints of the microlenses under manufacture. The elements 1202, 1302 comprise a PDAF element 1302 of a PDAF microlens under manufacture and an image capture element 1202 of an image capture microlens under manufacture. The PDAF element 1302 is formed with a width $EW_{AF}$ and/or a thickness $ET_{AF}$ different than a width $EW_{IC}$ and/or a thickness $ET_{IC}$ of the image capture element 1202 to vary properties (e.g., ROC, size, or the like) of the PDAF microlens relative to the image capture microlens.

As illustrated by FIG. 13B, the image capture and PDAF elements 1202, 1302 (see FIG. 13A) undergo one or more reflow and/or heating processes to round corners and to form corresponding microlenses 304, 316b.

With reference to FIGS. 14A-14E, cross-sectional views 1400A-1400E of some embodiments of the microlenses 140, 142 of FIG. 11 at various stages of manufacture are provided. These embodiments may, for example, be used when the microlenses 140, 142 of FIG. 11 are configured according to the microlenses 304, 316c of FIG. 3C.

Figure 14A:
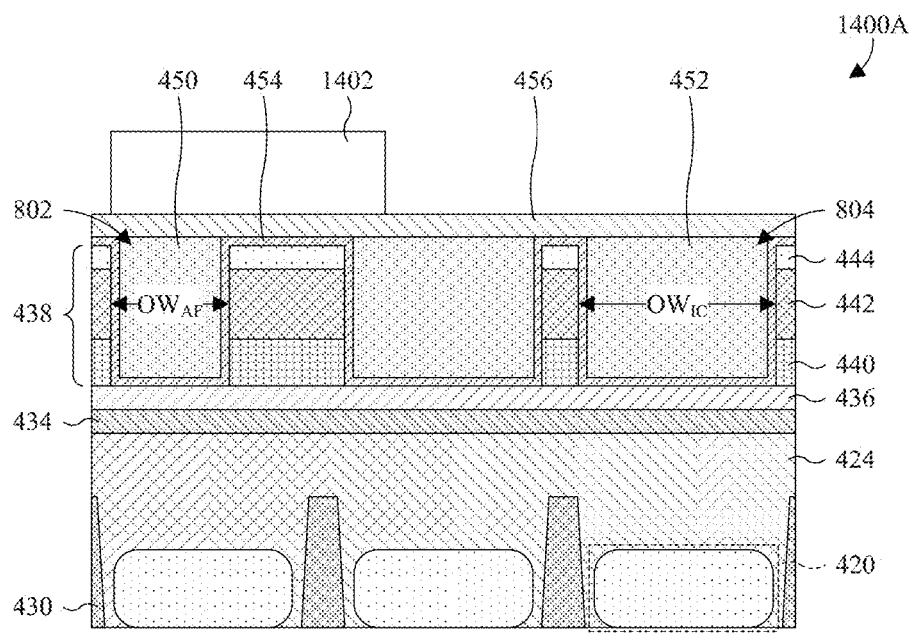

As illustrated by FIG. 14A, a PDAF microlens layer is formed and patterned to define a PDAF element 1402 corresponding to a PDAF microlens under manufacture. In some embodiments, the PDAF element 1402 is square or rectangular, and/or has a footprint of the PDAF capture microlens under manufacture.

Figure 14B:
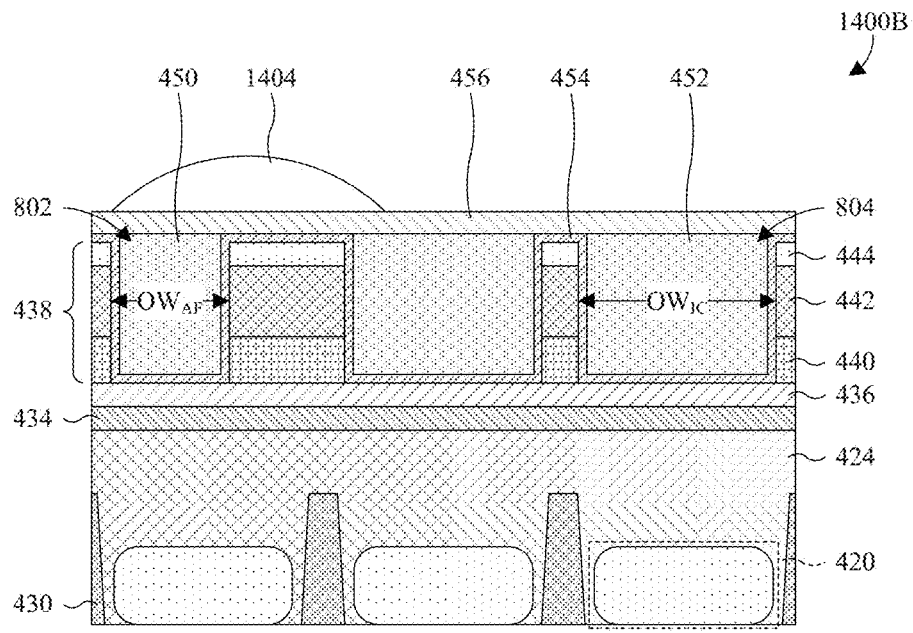

As illustrated by FIG. 14B, the PDAF element 1402 (see FIG. 14A) undergoes one or more reflow and/or heating processes to round corners and to form a PDAF microlens 1404.

Figure 14C:
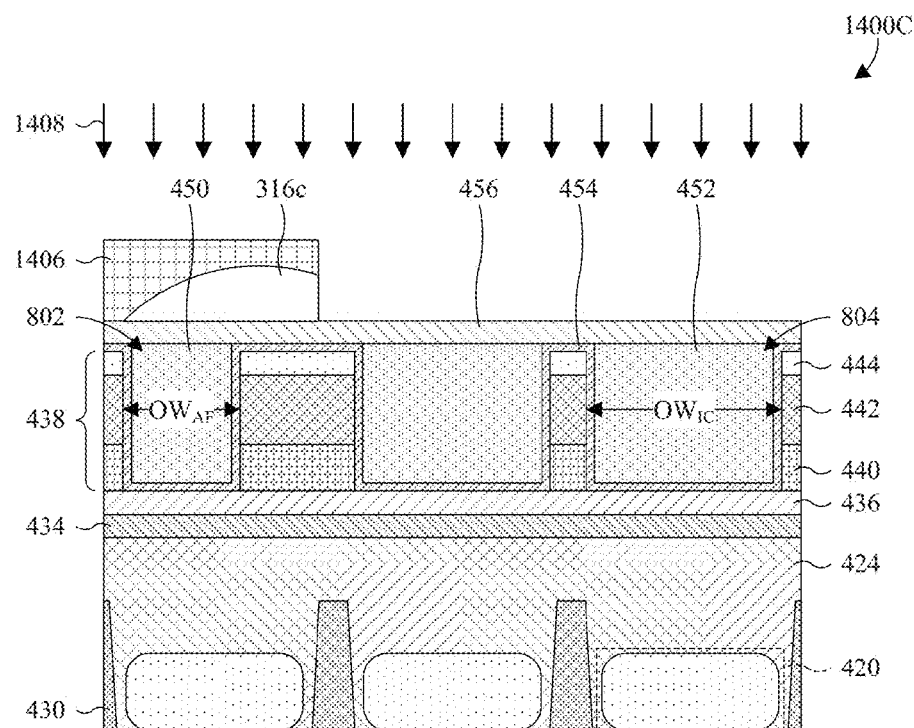

As illustrated by FIG. 14C, a second etch is performed to etch the PDAF microlens 1404 (see FIG. 14B), such that a resulting PDAF microlens 316c has an asymmetric profile. The process for performing the second etch may include forming a photoresist layer 1406 masking regions of the PDAF microlens 1404. One or more etchants 1408 may then be applied to exposed regions of the PDAF microlens 1404 to form the asymmetric PDAF microlens 316c. Thereafter, the photoresist layer 1406 may be removed.

Figure 14D:
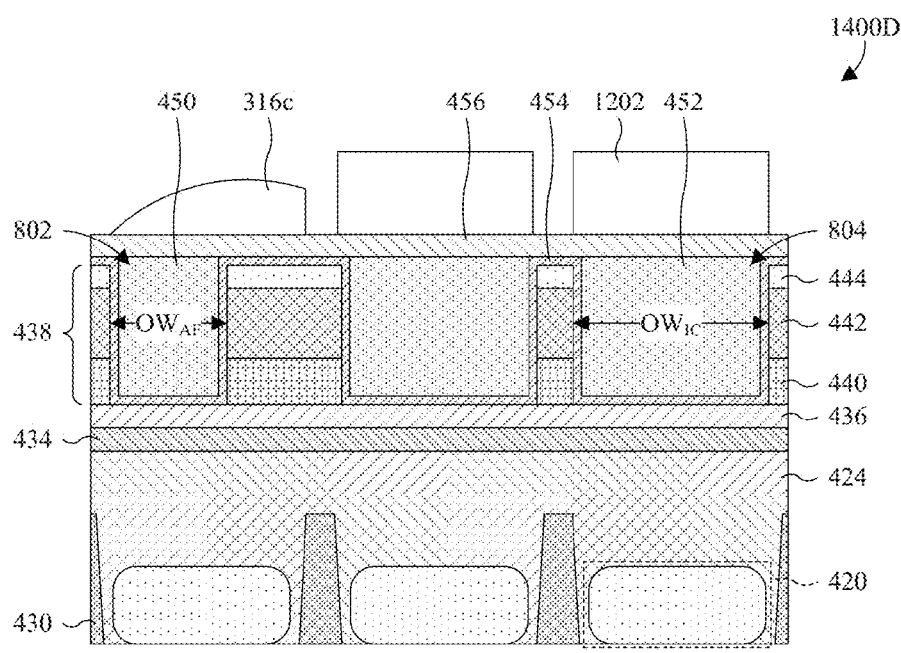

As illustrated by FIG. 14D, an image capture microlens layer is formed and patterned to define an image capture element 1202 corresponding to an image capture microlens under manufacture.

Figure 14E:
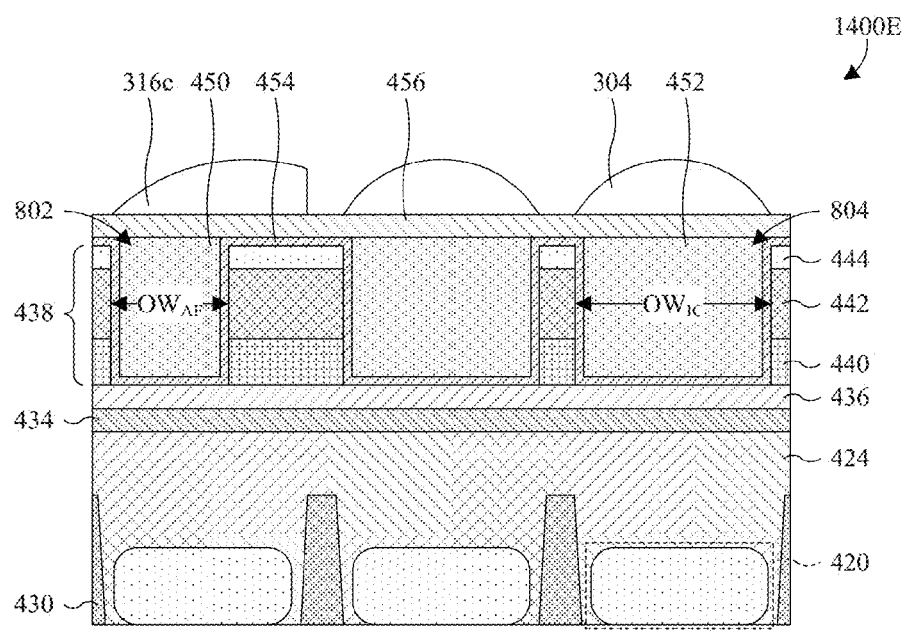

As illustrated by FIG. 14E, the image capture element 1202 undergoes one or more reflow and/or heating processes to round corners and to form an image capture microlenses 304.

Figure 15A:
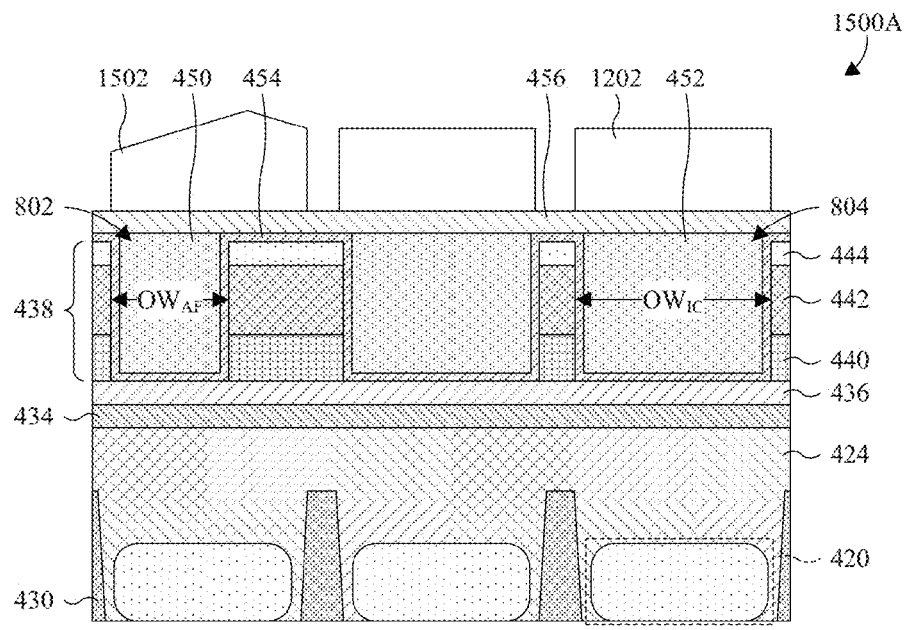
Figure 15B:
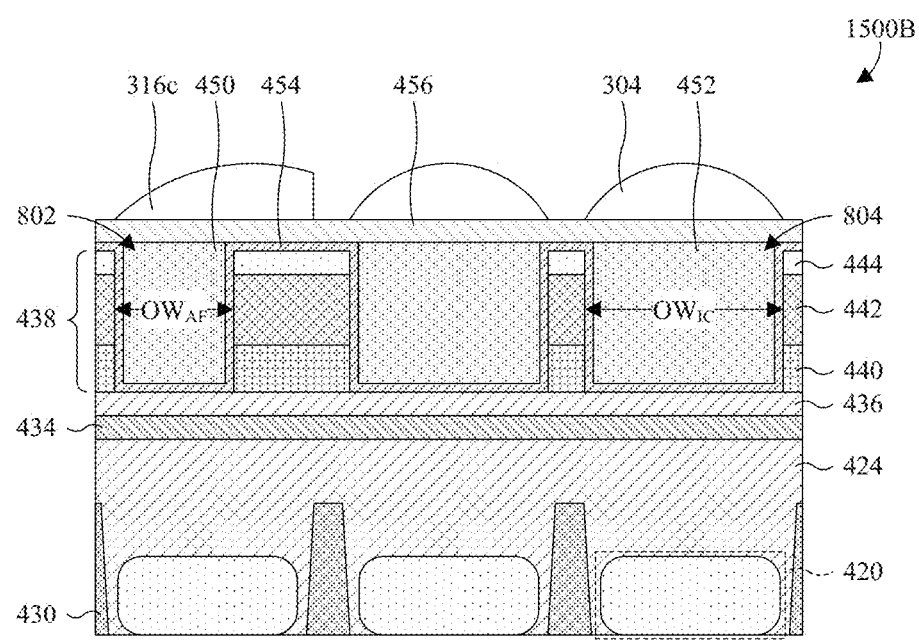

With reference to FIGS. 15A and 15B, cross-sectional views 1500A, 1500B of other embodiments of the microlenses 140, 142 of FIG. 11 at various stages of manufacture are provided. These embodiments may, for example, be used when the microlenses 140, 142 of FIG. 11 are configured according to the microlenses 304, 316c of FIG. 3C.

As illustrated by FIG. 15A, a microlens layer is formed and patterned to define elements 1202, 1502 corresponding to microlenses under manufacture. In some embodiments, the microlens is patterned using a graded mask to concurrently form the elements 1202, 1502. The elements 1202, 1502 comprise a PDAF element 1502 of a PDAF microlens under manufacture and an image capture element 1202 of an image capture microlens under manufacture. The PDAF element 1502 has an asymmetric profile, whereas the image capture element 1202 may, for example, have a symmetric profile.

As illustrated by FIG. 15B, the image capture and PDAF elements 1202, 1502 (see FIG. 15A) undergo one or more reflow and/or heating processes to round corners and to form corresponding microlenses 304, 316c.

Figure 16:
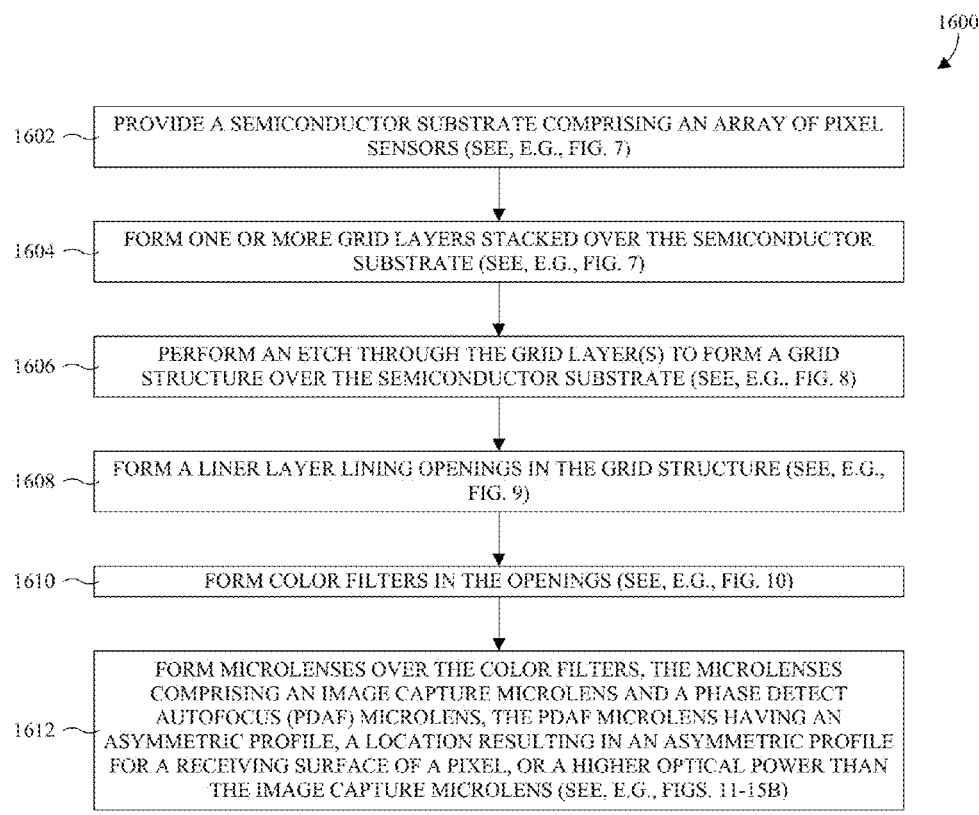
FIG. 16 illustrates a block diagram of some embodiments of a method for manufacturing the BSI image sensor of FIGS. 7-15B.

With reference to FIG. 16, a block diagram 1600 of some embodiments of a method for manufacturing the BSI image sensor of FIG. 4 is provided.

At 1602, a semiconductor substrate comprising an array of pixel sensors is provided. See, for example, FIG. 7.

At 1604, one or more optical isolation grid layers are formed stacked over the semiconductor substrate. See, for example, FIG. 7.

At 1606, an etch is performed into the grid layer(s) to form a grid structure over the semiconductor substrate. See, for example, FIG. 8.

At 1608, in some embodiments, a liner layer is formed lining openings in the grid structure. See, for example, FIG. 9.

At 1610, color filters are formed in the openings. See, for example, FIG. 10.

At 1612, microlenses are formed over the color filters. The microlenses comprise an image capture microlens and a PDAF microlens. The PDAF microlens has an asymmetric profile, a location resulting in an asymmetric profile for a receiving surface of a pixel, or a higher optical power than the image capture microlens. See, for example, FIGS. 11-15B.

Thus, as can be appreciated from above, the present disclosure provides an image sensor. A plurality of pixels comprises a PDAF pixel and an image capture pixel. Pixel sensors of the pixels are arranged in a semiconductor substrate. A grid structure is arranged over the semiconductor substrate, laterally surrounding color filters of the pixels. Microlenses of the pixels are arranged over the grid structure, and comprise a PDAF microlens of the PDAF pixel and an image capture microlens of the image capture pixel. The PDAF microlens comprises a larger optical power than the image capture microlens, or comprises a location or shape so a PDAF receiving surface of the PDAF pixel has an asymmetric profile.

In other embodiments, the present disclosure provides a method for manufacturing an image sensor. One or more grid layers are formed over a semiconductor substrate. The semiconductor substrate comprises a PDAF pixel sensor of a PDAF pixel and an image capture pixel sensor of an image capture pixel. An etch is performed into the one or more grid layers to form a grid structure comprising openings corresponding to the PDAF and image capture pixel sensors. Color filters are formed in the openings. Microlenses are formed over the color filters. The microlenses comprise a PDAF microlens of the PDAF pixel and an image capture microlens of the image capture pixel. Forming the microlenses comprises forming the PDAF microlens with a larger optical power than the image capture microlens, or forming the PDAF microlens with a location or shape so a radiation receiving surface of the PDAF pixel has an asymmetric profile.

In yet other embodiments, the present disclosure provides an image sensor. A plurality of pixels comprises a PDAF pixel and an image capture pixel. Pixel sensors of the pixels are arranged in a semiconductor substrate. The pixel sensors comprise a PDAF pixel sensor of the PDAF pixel. A grid structure is arranged over the semiconductor substrate, laterally surrounding color filters of the pixels. An image capture microlens of the image capture pixel is configured to focus incident radiation on an image capture focal plane arranged an image capture distance from the pixel sensors. A PDAF microlens of the PDAF pixel is configured to focus incident radiation on a PDAF focal plane arranged a PDAF distance from the PDAF pixel sensor. The PDAF distance is less than the image capture distance, or a center of the PDAF focal plane is laterally offset from a center of the PDAF pixel sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   a plurality of pixels comprising a phase detection autofocus (PDAF) pixel and an image capture pixel;
   pixel sensors of the pixels arranged in a semiconductor substrate, wherein the pixel sensors comprise a PDAF pixel sensor corresponding to the PDAF pixel, and wherein the pixel sensors further comprise an additional PDAF pixel sensor laterally adjacent to the PDAF pixel sensor;
   a grid structure arranged over the semiconductor substrate, laterally surrounding color filters of the pixels, wherein the grid structure comprises a metal grid structure and a dielectric grid structure overlying the metal grid structure, wherein the metal and dielectric grid structures collectively define openings filled by the color filters, and wherein the color filters comprise a PDAF color filter overlying the PDAF pixel sensor; and
   microlenses of the pixels arranged over the grid structure, and comprising a PDAF microlens of the PDAF pixel and an image capture microlens of the image capture pixel, wherein a center of the PDAF microlens is laterally offset from a center of the PDAF color filter;
   wherein the PDAF microlens comprises a larger optical power than the image capture microlens, or comprises a location or shape so a PDAF receiving surface of the PDAF pixel has an asymmetric profile, and wherein the PDAF microlens is arranged between and partially covers the PDAF pixel sensor and the additional PDAF pixel sensor, such that the PDAF microlens covers less than all of the PDAF pixel sensor and less than all of the additional PDAF pixel sensor.

2. The image sensor according to claim 1, wherein the PDAF microlens is arranged on a first side of the PDAF pixel, closer to the first side than a second side of the PDAF pixel that is opposite the first side.

3. The image sensor according to claim 1, wherein the PDAF color filter is directly over the PDAF pixel sensor, and wherein the metal grid structure and the dielectric grid structure both laterally contact substantially vertical sidewalls of the PDAF color filter that are on opposite sides of the PDAF color filter.

4. An image sensor comprising:
a plurality of pixels comprising a phase detection autofocus (PDAF) pixel and an image capture pixel;
pixel sensors of the pixels arranged in a semiconductor substrate, the pixel sensors comprising a PDAF pixel sensor of the PDAF pixel;
color filters of the pixels comprising a PDAF color filter and a pair of image capture color filters;
a grid structure arranged over the semiconductor substrate, wherein the grid structure laterally surrounds the color filters of the pixels and partially covers the PDAF pixel sensor, wherein the grid structure comprises a conductive grid structure and a dielectric grid structure overlying the conductive grid structure, and wherein the conductive and dielectric grid structures collectively define openings filled by the color filters;
an image capture microlens of the image capture pixel configured to focus incident radiation on an image capture focal plane arranged an image capture distance from the pixel sensors; and
a PDAF microlens of the PDAF pixel configured to focus incident radiation on a PDAF focal plane arranged a PDAF distance from the PDAF pixel sensor;
wherein the PDAF distance is less than the image capture distance, or a center of the PDAF focal plane is laterally offset from a center of the PDAF pixel sensor, wherein the image capture focal plane is spaced below the pixel sensors, and wherein the PDAF focal plane is spaced between the pixel sensors and the image capture focal plane.

5. The image sensor according to claim 4, wherein the PDAF microlens has an asymmetric profile.

6. The image sensor according to claim 4, wherein a refractive index of the PDAF microlens is larger than a refractive index of the image capture microlens.

7. The image sensor according to claim 4, wherein a thickness of the PDAF microlens is larger than a thickness of the image capture microlens.

8. The image sensor according to claim 7, wherein a radius of curvature (ROC) of the PDAF microlens is less than a ROC of the image capture microlens.

9. The image sensor according to claim 4, wherein a width of the PDAF color filter is less than a width of the image capture color filters.

10. The image sensor according to claim 4, wherein the PDAF microlens and the image capture microlens are respectively arranged directly over the PDAF color filter and one of the image capture color filters.

11. The image sensor according to claim 4, wherein the PDAF microlens is thicker than the image capture microlens, and wherein a radius of curvature (ROC) of the PDAF microlens is less than a ROC of the image capture microlens.

12. The image sensor according to claim 4, wherein the PDAF microlens has an asymmetric profile about a widthwise center of the PDAF microlens, and wherein the PDAF microlens has a curved, convex top surface.

13. The image sensor according to claim 4, wherein top surfaces respectively of the image capture color filters and a top surface of the PDAF color filter are approximately even with a top surface of the grid structure.

14. An image sensor comprising:
a semiconductor substrate comprising a phase detection autofocus (PDAF) pixel sensor and an image capture (IC) pixel sensor;
a composite grid structure arranged over the semiconductor substrate, wherein the composite grid structure comprises a metal grid, a hard mask grid, and a dielectric grid, wherein the dielectric grid overlies the metal grid, between the metal grid and the hard mask grid, wherein the hard mask grid is a different material than the dielectric grid, wherein the metal, hard mask, and dielectric grids collectively define a PDAF opening and an IC opening respectively arranged directly over the PDAF pixel sensor and the IC pixel sensor, and wherein the composite grid structure partially covers the PDAF pixel sensor;
a PDAF color filter and an IC color filter respectively arranged in the PDAF opening and the IC opening, wherein the PDAF color filter directly contacts the composite grid structure and has a first width less than a second width of the IC color filter; and
a PDAF microlens and an IC microlens respectively arranged directly over the PDAF color filter and the IC color filter, and configured to focus incident radiation respectively on a PDAF focal plane and an IC focal plane, wherein the PDAF focal plane has an orientation relative to the PDAF pixel sensor that is different than an orientation of the IC focal plane relative to the IC pixel sensor, wherein the IC focal plane is spaced below the PDAF and IC pixel sensors, and wherein the PDAF focal plane is spaced between the PDAF and IC pixel sensors and the IC focal plane.

15. The image sensor according to claim 14, wherein the semiconductor substrate comprises an additional PDAF pixel sensor laterally adjacent to the PDAF pixel sensor.

16. The image sensor according to claim 14, wherein a refractive index of the PDAF microlens or an optical power of the PDAF microlens is greater than that of the IC microlens.

17. The image sensor according to claim 14, wherein the PDAF microlens has an asymmetric profile.

18. The image sensor according to claim 14, wherein a thickness of the PDAF microlens is larger than a thickness of the IC microlens.

19. The image sensor according to claim 14, wherein a radius of curvature (ROC) of the PDAF microlens is less than a ROC of the IC microlens.

* * * * *